United States Patent
Wu

(10) Patent No.: US 12,113,527 B2
(45) Date of Patent: Oct. 8, 2024

(54) OFF-CHIP DRIVER

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 180 days.

(21) Appl. No.: 17/886,473

(22) Filed: Aug. 12, 2022

(65) Prior Publication Data

US 2024/0056077 A1 Feb. 15, 2024

(51) Int. Cl.
*H03K 19/00* (2006.01)
*H03K 19/0185* (2006.01)

(52) U.S. Cl.
CPC . *H03K 19/0005* (2013.01); *H03K 19/018557* (2013.01)

(58) Field of Classification Search
None
See application file for complete search history.

(56) References Cited

U.S. PATENT DOCUMENTS

| 5,602,494 | A | 2/1997 | Sundstrom |
| 6,281,709 | B1 | 8/2001 | Seyyedy |
| 6,573,753 | B1 | 6/2003 | Snyder |
| 8,427,198 | B1 | 4/2013 | Cheruku et al. |
| 10,693,460 | B1* | 6/2020 | Takahashi ........... G11C 11/4093 |
| 2003/0112042 | A1 | 6/2003 | Takahashi |
| 2005/0057281 | A1* | 3/2005 | Yoo ..................... G11C 7/1051 |
| | | | 326/87 |
| 2015/0171863 | A1 | 6/2015 | Ha |
| 2016/0134285 | A1 | 5/2016 | Ha |
| 2016/0254812 | A1 | 9/2016 | Miwa |
| 2017/0154668 | A1 | 6/2017 | Ha |

FOREIGN PATENT DOCUMENTS

TW 202207624 2/2022

OTHER PUBLICATIONS

"Office Action of Taiwan Counterpart Application", issued on Sep. 28, 2023, p. 1-p. 6.

* cited by examiner

*Primary Examiner* — Jany Richardson
(74) *Attorney, Agent, or Firm* — JCIPRNET

(57) ABSTRACT

An off-chip driver (OCD), including a pull-up driver and a pull-down driver, is provided. The pull-up driver and the pull-down driver are coupled to an output pad. One of the pull-up driver and the pull-down driver includes a main driving circuit, an auxiliary driving circuit, a connection circuit, and a common impedance. The main driving circuit is used to perform an output driving operation on the output pad, and the auxiliary driving circuit is used to selectively perform the output driving operation on the output pad. A first terminal of the common impedance is coupled to a driving terminal of the main driving circuit and a driving terminal of the auxiliary driving circuit through the connection circuit. A second terminal of the common impedance is coupled to the output pad.

9 Claims, 13 Drawing Sheets

OFF-CHIP DRIVER

BACKGROUND

Technical Field

The disclosure relates to an integrated circuit, and more particularly to an off-chip driver (OCD) configured in the integrated circuit.

Description of Related Art

The off-chip driver (OCD) configured in the integrated circuit may be used as an output buffer or a transmitter of the integrated circuit. The off-chip driver may output a signal to an external circuit. Similar to the output buffer, the off-chip driver is also required to have sufficient driving ability (output current). In addition, the off-chip driver is also required to have impedance matching ability and/or the ability to adjust the slew rate. The circuit design of the OCD also affects the size of the output capacitance for the pad of the OCD, and the specification of Dynamic Random Access Memory (DRAM) limits the size of the output capacitance. How to implement the off-chip driver is one of the many technical issues in integrated circuit design.

SUMMARY

The disclosure provides an off-chip driver (OCD) to perform an output driving operation on an external circuit connected to an output pad.

In an embodiment of the disclosure, the off-chip driver is configured in an integrated circuit. The off-chip driver includes a pull-up driver and a pull-down driver. The pull-up driver and the pull-down driver are coupled to an output pad of the integrated circuit. One of the pull-up driver and the pull-down driver includes a first main driving circuit, at least one first auxiliary driving circuit, a first connection circuit, and a first common impedance. The first main driving circuit is used to perform an output driving operation on the output pad, and the at least one first auxiliary driving circuit is used to selectively perform the output driving operation on the output pad. The first connection circuit is coupled to a driving terminal of the first main driving circuit and a driving terminal of each of the at least one first auxiliary driving circuit. A first terminal of the first common impedance is coupled to the first connection circuit. The first terminal of the first common impedance is coupled to the driving terminal of the first main driving circuit and the driving terminal of each of the at least one first auxiliary driving circuit through the first connection circuit. A second terminal of the first common impedance is coupled to the output pad.

Based on the above, the output pad according to the embodiments of the disclosure is coupled to the first main driving circuit and the first auxiliary driving circuit through the first common impedance and the first connection circuit. The first main driving circuit and the first auxiliary driving circuit may share the first common impedance. Besides the first main driving circuit that may perform the output driving operation on the output pad through the first common impedance and first connection circuit, the first auxiliary driving circuit may also selectively perform the output driving operation on the output pad through the same first common impedance and first connection circuit. Therefore, the off-chip driver may perform the output driving operation on the external circuit connected to the output pad.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
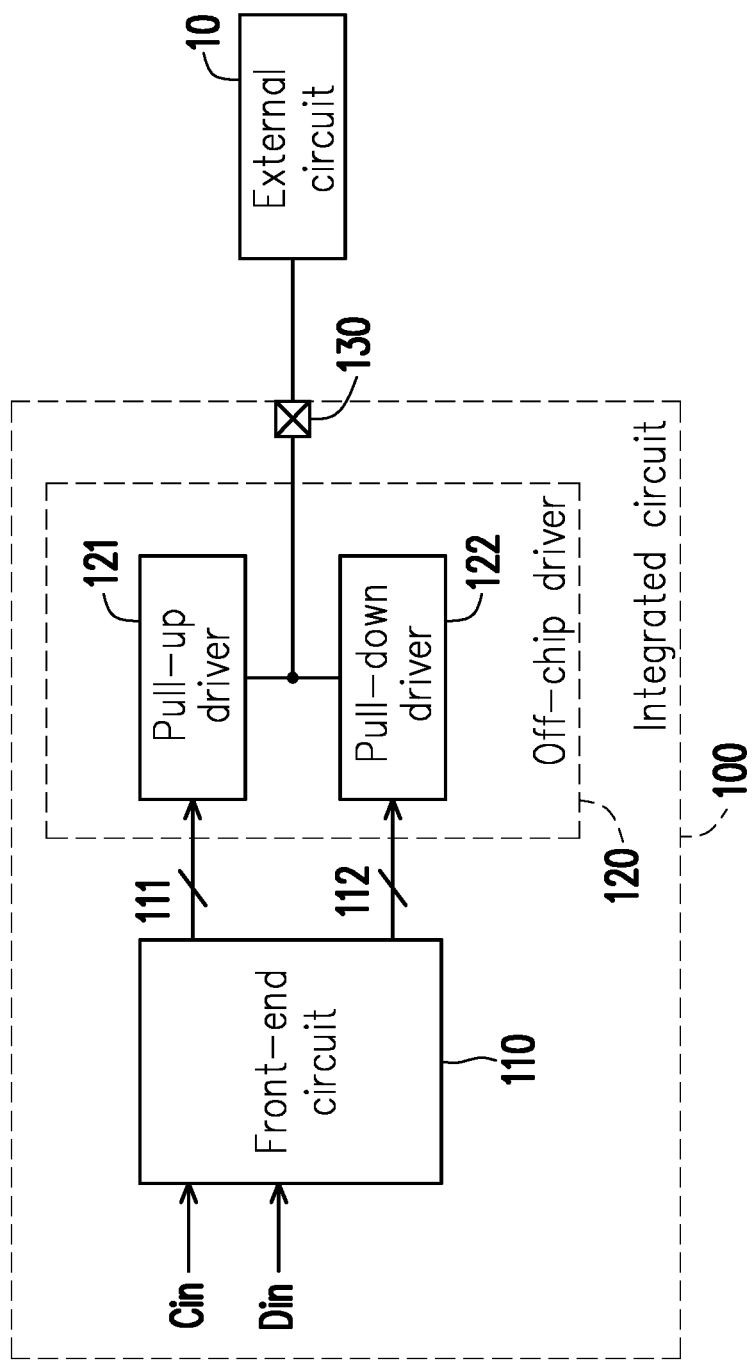
FIG. 1 is a schematic diagram of a circuit block of an integrated circuit according to an embodiment of the disclosure.

The term "coupling (or connection)" as used throughout the specification (including the claims) may refer to any direct or indirect means of connection. For example, if a first device is described as being coupled (or connected) to a second device, it should be interpreted that the first device may be directly connected to the second device, or the first device may be indirectly connected to the second device through other devices or certain connection means. Terms such as "first" and "second" mentioned throughout the specification of the disclosure (including the claims) are used to name the elements or to distinguish different embodiments or ranges, rather than to limit the upper limit or the lower limit of the number of elements, nor to limit the order of elements. Also, wherever possible, elements/components/steps using the same reference numerals in the drawings and embodiments represent the same or similar parts. The relevant description of elements/components/steps that use the same reference numerals or use the same terminology in different embodiments may be cross-referenced.

FIG. 1 is a schematic diagram of a circuit block of an integrated circuit 100 according to an embodiment of the disclosure. According to the actual design, the integrated circuit 100 may exist in a dynamic random access memory (DRAM) or other integrated circuits. The integrated circuit 100 shown in FIG. 1 includes a front-end circuit 110, an off-chip driver (OCD) 120, and an output pad 130. The output pad 130 is adapted to be electrically connected to an external circuit 10 (a next stage circuit).

The embodiment does not limit the implementation details of the front-end circuit 110. According to the actual design, in some embodiments, the front-end circuit 110 may include a conventional OCD front-end driver or other OCD front-end drivers. As shown in FIG. 1, Din represents data input, and Cin represents control signal input. The front-end circuit 110 may execute several control behaviors, such as on-die termination (ODT) control, ZQ calibration control, slew rate (SR) control, duty adjustment, and/or other control behaviors, on the OCD 120. The front-end circuit 110 is coupled to the OCD 120 to provide a control signal 111 and a control signal 112. The OCD 120 is coupled to the output pad 130. Based on the control of the front-end circuit 110, the OCD 120 may perform an output driving operation on the external circuit 10, that is, output a signal to the external circuit 10 through the output pad 130.

The OCD 120 includes a pull-up driver 121 and a pull-down driver 122. The pull-up driver 121 and the pull-down driver 122 are commonly coupled to the output pad 130. Based on the control of the control signal 111 and the control signal 112, the pull-up driver 121 and the pull-down driver 122 may commonly perform the output driving operation on the output pad 130.

Figure 2:
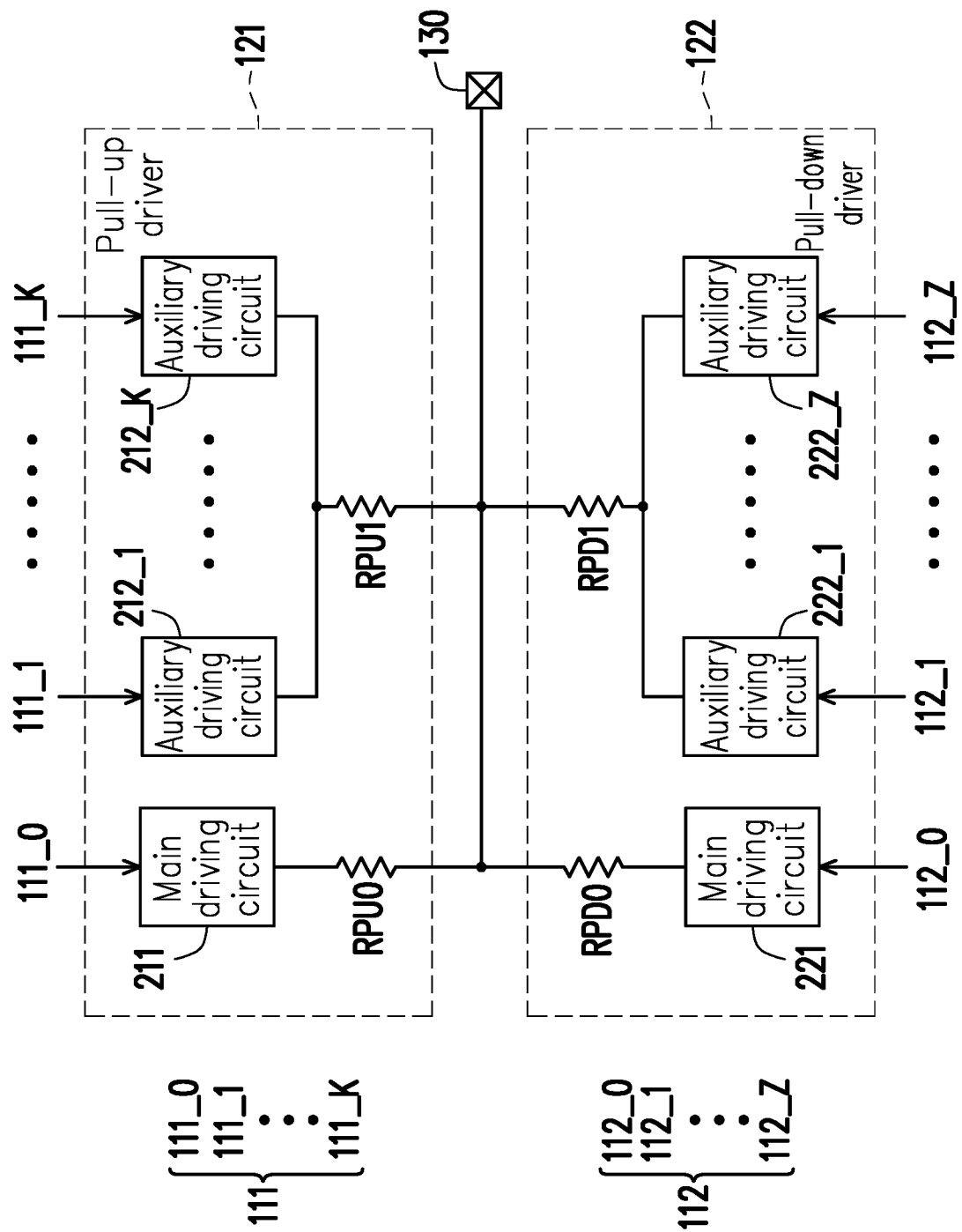
FIG. 2 is a schematic diagram of a circuit block of a pull-up driver and a pull-down driver shown in FIG. 1 according to an embodiment of the disclosure.

FIG. 2 is a schematic diagram of a circuit block of the pull-up driver 121 and the pull-down driver 122 shown in FIG. 1 according to an embodiment. In the embodiment shown in FIG. 2, the pull-up driver 121 includes a main driving circuit 211 and at least one auxiliary driving circuit, such as K auxiliary driving circuits 212_1, . . . , and 212_K shown in FIG. 2, where K is an integer determined according to the actual design. In addition, the pull-up driver 121 further includes a main pull-up resistor RPU0 and an auxiliary pull-up resistor RPU1. The resistance values of the main pull-up resistor RPU0 and the auxiliary pull-up resistor RPU1 may be determined according to the actual design. A first terminal of the main pull-up resistor RPU0 is coupled to a driving terminal of the main driving circuit 211, and a second terminal of the main pull-up resistor RPU0 is coupled to the output pad 130. A first terminal of the auxiliary pull-up resistor RPU1 is coupled to driving terminals of the auxiliary driving circuits 212_1 to 212_K, and a second terminal of the auxiliary pull-up resistor RPU1 is coupled to the output pad 130. The main pull-up resistor RPU0 and the auxiliary pull-up resistor RPU1 not only provide resistance values that meet the specifications of the DRAM, but also function as electrostatic discharge (ESD) protection elements at the same time.

In the embodiment shown in FIG. 2, the control signal 111 includes control signals 111_0, 111_1, . . . , and 111_K. A control terminal of the main driving circuit 211 is coupled to the front-end circuit 110 to receive the control signal 111_0. A control terminal of the auxiliary driving circuit 212_1 is coupled to the front-end circuit 110 to receive the control signal 111_1. By analogy, a control terminal of the auxiliary driving circuit 212_K is coupled to the front-end circuit 110 to receive the control signal 111_K. Based on the control of the control signal 111_0, the main driving circuit 211 may perform the output driving operation on the output pad 130 through the main pull-up resistor RPU0. Based on the control of the control signals 111_1 to 111_K, the auxiliary driving circuits 212_1 to 212_K may selectively perform the output driving operation on the output pad 130 through the auxiliary pull-up resistor RPU1.

When the control signals 111_1 to 111_K disable the auxiliary driving circuits 212_1 to 212_K, an output current of the output pad 130 is only provided by the main driving circuit 211. Based on compensation for process offset and/or other requirements (for example, impedance matching or slew rate adjustment), one or more of the auxiliary driving circuits 212_1 to 212_K may be selectively enabled. The enabled auxiliary driving circuit may perform the output driving operation on the output pad 130 together with the main driving circuit 211.

In the embodiment shown in FIG. 2, the pull-down driver 122 includes a main pull-down resistor RPD0, an auxiliary pull-down resistor RPD1, a main driving circuit 221, and at least one auxiliary driving circuit, such as Z auxiliary driving circuits 222_1, . . . , and 222_Z shown in FIG. 2, where Z is an integer determined according to the actual design. The resistance values of the main pull-down resistor RPD0 and the auxiliary pull-down resistor RPD1 may be determined according to the actual design. In the embodiment shown in FIG. 2, the control signal 112 includes control signals 112_0, 112_1, . . . , and 112_Z. Control terminals of the main driving circuit 221 and the auxiliary driving circuits 222_1 to 222_Z are coupled to the front-end circuit 110 to receive the control signals 112_0 to 112_Z.

The main driving circuit 221, the auxiliary driving circuits 222_1 to 222_Z, the main pull-down resistor RPD0, and the auxiliary pull-down resistor RPD1 may be analogized with reference to the relevant description of the main driving circuit 211, the auxiliary driving circuits 212_1 to 212_K, the main pull-up resistor RPU0, and the auxiliary pull-up resistor RPU1, so there will be no repetition. The number K of the auxiliary driving circuits 212_1 to 212_K and the number Z of the auxiliary driving circuits 222_1 to 222_Z can be determined according to the actual design. In some embodiments, the number K may be the same as the number Z. In other embodiments, the number K may be different from the number Z. When the control signals 112_1 to 112_Z disable the auxiliary driving circuits 222_1 to 222_Z, only the main driving circuit 221 draws current to the output pad 130. Based on compensation for process offset and/or other requirements (for example, impedance matching or slew rate adjustment), one or more of the auxiliary driving circuits 222_1 to 222_Z may be selectively enabled. The enabled auxiliary driving circuit may perform the output driving operation on the output pad 130 together with the main driving circuit 221.

Figure 3:
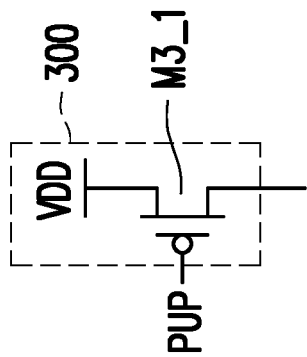
FIG. 3 is a schematic diagram of a circuit block of a driving circuit according to an embodiment of the disclosure.

FIG. 3 is a schematic diagram of a circuit block of a pull-up driving circuit 300 according to an embodiment of the disclosure. For any one of the main driving circuit 211 and the auxiliary driving circuits 212_1 to 212_K shown in FIG. 2, reference may be made to the relevant description of the pull-up driving circuit 300 shown in FIG. 3. In the embodiment shown in FIG. 3, the pull-up driving circuit 300 includes a transistor M3_1. A first terminal (for example, a source) of the transistor M3_1 is coupled to a voltage source VDD. A second terminal (for example, a drain) of the transistor M3_1 is coupled to a driving terminal of the pull-up driving circuit 300. A control terminal (for example, a gate) of transistor M3_1 is controlled by a control signal PUP. For the control signal PUP shown in FIG. 3, reference may be made to the relevant description of any one of the control signals 111_0, 111_1, . . . , and 111_K shown in FIG. 2. For example, in the case where the pull-up driving circuit 300 shown in FIG. 3 is used as the main driving circuit 211 shown in FIG. 2, the control signal PUP shown in FIG. 3 may be used as the control signal 111_0 shown in FIG. 2.

Figure 4:
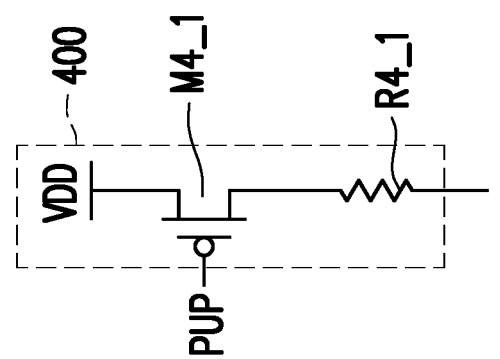
FIG. 4 is a schematic diagram of a circuit block of a driving circuit according to another embodiment of the disclosure.

FIG. 4 is a schematic diagram of a circuit block of a pull-up driving circuit 400 according to another embodiment of the disclosure. For any one of the main driving circuit 211 and the auxiliary driving circuits 212_1 to 212_K shown in FIG. 2, reference may be made to the relevant description of the pull-up driving circuit 400 shown in FIG. 4. In the embodiment shown in FIG. 4, the pull-up driving circuit 400 includes a transistor M4_1 and a resistor R4_1. A first terminal (for example, a source) of the transistor M4_1 is coupled to a voltage source VDD. A control terminal (for example, a gate) of transistor M4_1 is controlled by a control signal PUP. The control signal PUP shown in FIG. 4 may be analogized with reference to the relevant description of the control signal PUP shown in FIG. 3, so there will be no repetition. A first terminal of the resistor R4_1 is coupled to a second terminal (for example, a drain) of the transistor M4_1. A second terminal of the resistor R4_1 is coupled to a driving terminal of the pull-up driving circuit 400.

Figure 5:
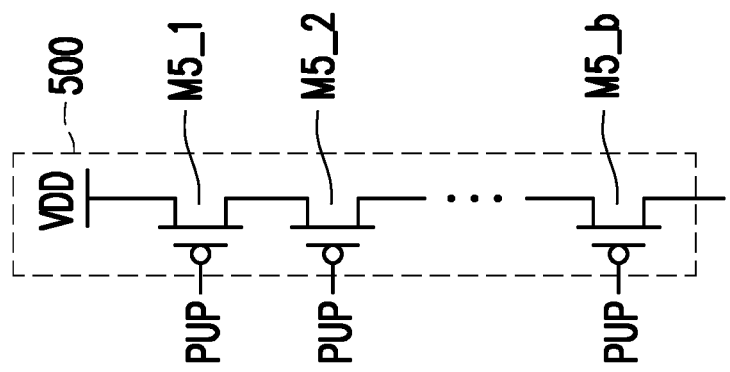
FIG. 5 is a schematic diagram of a circuit block of a driving circuit according to yet another embodiment of the disclosure.

FIG. 5 is a schematic diagram of a circuit block of a pull-up driving circuit 500 according to yet another embodiment of the disclosure. For any one of the main driving circuit 211 and the auxiliary driving circuits 212_1 to 212_K shown in FIG. 2, reference may be made to the relevant description of the pull-up driving circuit 500 shown in FIG. 5. In the embodiment shown in FIG. 5, the pull-up driving circuit 500 includes multiple transistors, such as transistors M5_1, M5_2, . . . , and M5_b shown in FIG. 5, where b is an integer determined according to the actual design. The transistors M5_1 to M5_b are connected in series between a voltage source VDD and a driving terminal of the pull-up driving circuit 500. A control terminal (for example, a gate) of each of the transistors M5_1 to M5_b is controlled by a control signal PUP. The control signal PUP shown in FIG. 5 may be analogized with reference to the relevant description of the control signal PUP shown in FIG. 3, so there will be no repetition.

Figure 6:
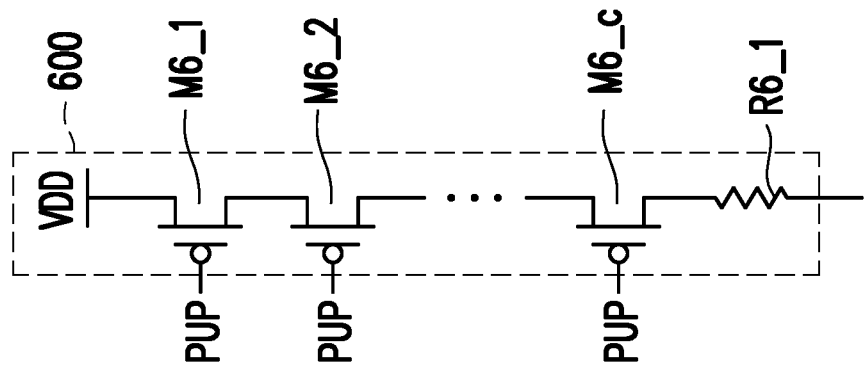
FIG. 6 is a schematic diagram of a circuit block of a driving circuit according to still another embodiment of the disclosure.

FIG. 6 is a schematic diagram of a circuit block of a pull-up driving circuit 600 according to still another embodiment of the disclosure. For any one of the main driving circuit 211 and the auxiliary driving circuits 212_1 to 212_K shown in FIG. 2, reference may be made to the relevant description of the pull-up driving circuit 600 shown in FIG. 6. In the embodiment shown in FIG. 6, the pull-up driving circuit 600 includes multiple transistors, such as transistors M6_1, M6_2, . . . , and M6_c shown in FIG. 6, where c is an integer determined according to the actual design. The pull-up driving circuit 600 also includes a resistor R6_1. A first terminal of the resistor R6_1 is coupled to a driving terminal of the pull-up driving circuit 600. The transistors M6_1 to M6_c are connected in series between a voltage source VDD and a second terminal of the resistor R6_1. A control terminal (for example, a gate) of each of the transistors M6_1 to M6_c is controlled by a control signal PUP. The control signal PUP shown in FIG. 6 may be analogized with reference to the relevant description of the control signal PUP shown in FIG. 3, so there will be no repetition.

Figure 7:
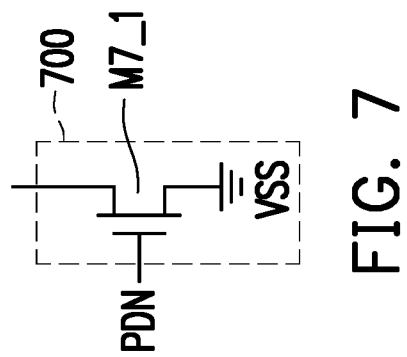
FIG. 7 is a schematic diagram of a circuit block of a driving circuit according to another embodiment of the disclosure.

FIG. 7 is a schematic diagram of a circuit block of a pull-down driving circuit 700 according to another embodiment of the disclosure. For any one of the main driving circuit 221 and the auxiliary driving circuits 222_1 to 222_Z shown in FIG. 2, reference may be made to the relevant description of the pull-down driving circuit 700 shown in FIG. 7. In the embodiment shown in FIG. 7, the pull-down driving circuit 700 includes a transistor M7_1. A first terminal (for example, a source) of the transistor M7_1 is coupled to a voltage source VSS. A second terminal (for example, a drain) of the transistor M7_1 is coupled to a driving terminal of the pull-down driving circuit 700. A control terminal (for example, a gate) of transistor M7_1 is controlled by a control signal PDN. For the control signal PDN shown in FIG. 7, reference may be made to the relevant description of any one of the control signals 112_0 to 112_Z shown in FIG. 2. For example, in the case where the pull-down driving circuit 700 shown in FIG. 7 is used as the main driving circuit 221 shown in FIG. 2, the control signal PDN shown in FIG. 7 may be used as the control signal 112_0 shown in FIG. 2.

Figure 8:
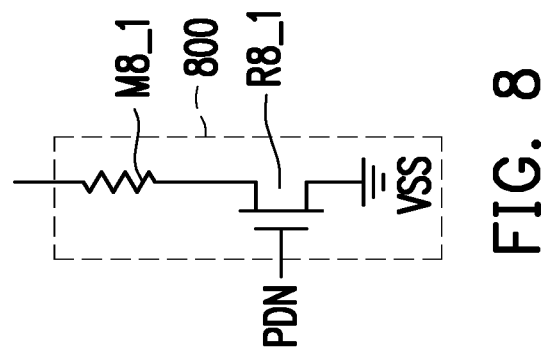
FIG. 8 is a schematic diagram of a circuit block of a driving circuit according to yet another embodiment of the disclosure.

FIG. 8 is a schematic diagram of a circuit block of a pull-down driving circuit 800 according to yet another embodiment of the disclosure. For any one of the main driving circuit 221 and the auxiliary driving circuits 222_1 to 222_Z shown in FIG. 2, reference may be made to the relevant description of the pull-down driving circuit 800 shown in FIG. 8. In the embodiment shown in FIG. 8, the pull-down driving circuit 800 includes a transistor M8_1 and a resistor R8_1. A first terminal (for example, a source) of the transistor M8_1 is coupled to a voltage source VSS. A control terminal (for example, a gate) of the transistor M8_1 is controlled by a control signal PDN. The control signal PDN shown in FIG. 8 may be analogized with reference to the relevant description of the control signal PDN shown in FIG. 7, so there will be no repetition. A first terminal of the resistor R8_1 is coupled to a second terminal (for example, a drain) of the transistor M8_1. A second terminal of the resistor R8_1 is coupled to a driving terminal of the pull-down driving circuit 800.

Figure 9:
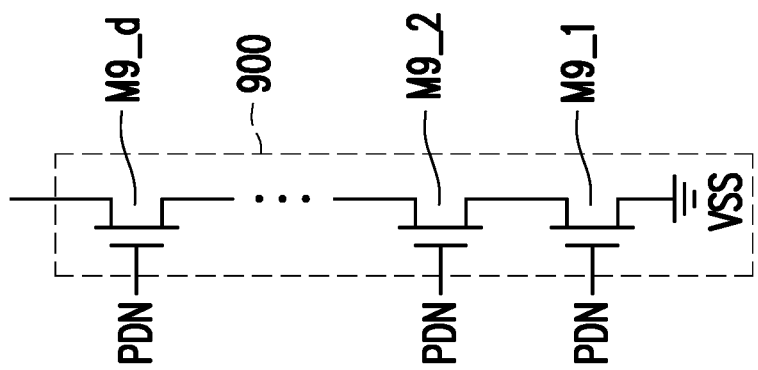
FIG. 9 is a schematic diagram of a circuit block of a driving circuit according to yet another embodiment of the disclosure.

FIG. 9 is a schematic diagram of a circuit block of a pull-down driving circuit 900 according to yet another embodiment of the disclosure. For any one of the main driving circuit 221 and the auxiliary driving circuits 222_1 to 222_Z shown in FIG. 2, reference may be made to the relevant description of the pull-down driving circuit 900 shown in FIG. 9. In the embodiment shown in FIG. 9, the pull-down driving circuit 900 includes multiple transistors, such as transistors M9_1, M9_2, . . . , and M9_d shown in FIG. 9, where d is an integer determined according to the actual design. The transistors M9_1 to M9_d are connected in series between a voltage source VSS and a driving terminal of the pull-down driving circuit 900. A control terminal (for example, a gate) of each of the transistors M9_1 to M9_d is controlled by a control signal PDN. The control signal PDN shown in FIG. 9 may be analogized with reference to the relevant description of the control signal PDN shown in FIG. 7, so there will be no repetition.

Figure 10:
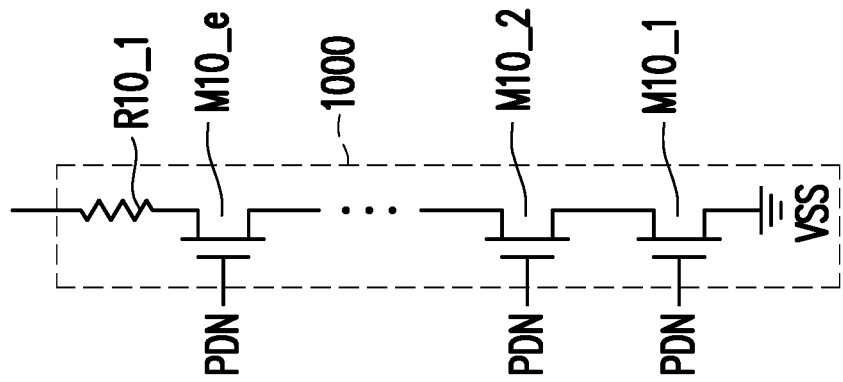
FIG. 10 is a schematic diagram of a circuit block of a driving circuit according to still another embodiment of the disclosure.

FIG. 10 is a schematic diagram of a circuit block of a pull-down driving circuit 1000 according to yet another embodiment of the disclosure. For any one of the main driving circuit 221 and the auxiliary driving circuits 222_1 to 222_Z shown in FIG. 2, reference may be made to the relevant description of the pull-down driving circuit 1000 shown in FIG. 10. In the embodiment shown in FIG. 10, the pull-down driving circuit 1000 includes multiple transistors, such as transistors M10_1, M10_2, . . . , and M10_e shown in FIG. 10, where e is an integer determined according to the actual design. The pull-down driving circuit 1000 also includes a resistor R10_1. A first terminal of the resistor R10_1 is coupled to a driving terminal of the pull-down driving circuit 1000. The transistors M10_1 to M10_e are connected in series between a voltage source VSS and a second terminal of the resistor R10_1. A control terminal (for example, a gate) of each of the transistors M10_1 to M10_e is controlled by a control signal PDN. The control signal PDN shown in FIG. 10 may be analogized with reference to the relevant description of the control signal PDN shown in FIG. 7, so there will be no repetition.

Figure 11:
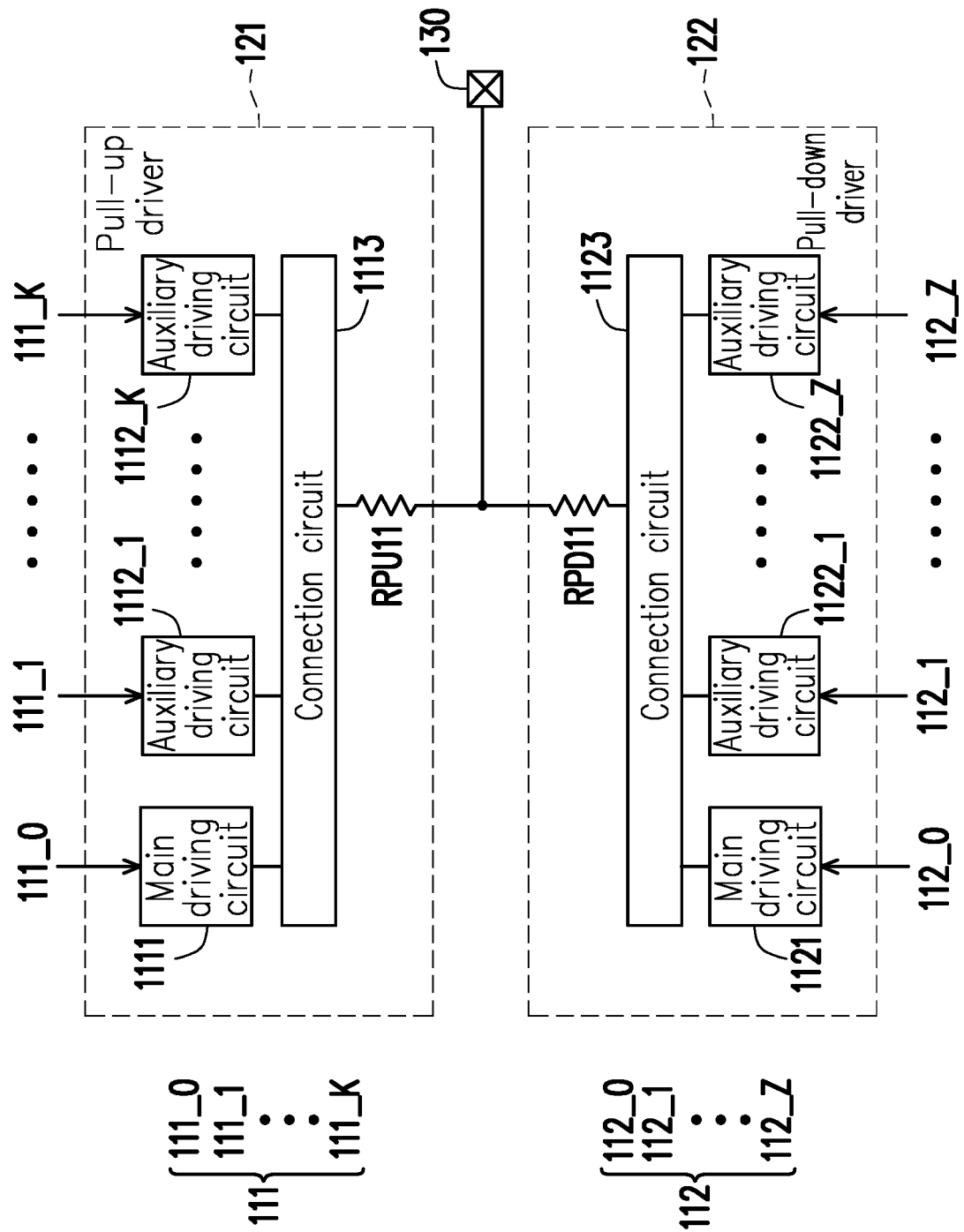
FIG. 11 is a schematic diagram of a circuit block of the pull-up driver and the pull-down driver shown in FIG. 1 according to an embodiment of the disclosure.

FIG. 11 is a schematic diagram of a circuit block of the pull-up driver 121 and the pull-down driver 122 shown in FIG. 1 according to an embodiment of the disclosure. In the embodiment shown in FIG. 11, the pull-up driver 121 includes a main driving circuit 1111 and at least one auxiliary driving circuit, such as K auxiliary driving circuits 1112_1, . . . , and 1112_K shown in FIG. 11. The control signal 111 includes control signals 111_0, 111_1, . . . , and 111_K. Control terminals of the main driving circuit 1111 and the auxiliary driving circuits 1112_1 to 1112_K are coupled to the front-end circuit 110 to receive the control signals 111_0 to 111_K. The main driving circuit 1111 and the auxiliary driving circuits 1112_1 to 1112_K shown in FIG. 11 may be analogized with reference to the relevant description of the main driving circuit 211 and the auxiliary driving circuits 212_1 to 212_K shown in FIG. 2, so there will be no repetition. For any one of the main driving circuit 1111 and the auxiliary driving circuits 1112_1 to 1112_K shown in FIG. 11, reference may be made to the relevant description of the pull-up driving circuit 300 shown in FIG. 3, the pull-up driving circuit 400 shown in FIG. 4, the pull-up driving circuit 500 shown in FIG. 5, or the pull-up driving circuit 600 shown in FIG. 6.

In the embodiment shown in FIG. 11, the pull-up driver 121 further includes a connection circuit 1113 and a common impedance RPU11. The connection circuit 1113 is coupled to a driving terminal of the main driving circuit 1111 and a driving terminal of each of the auxiliary driving circuits 1112_1 to 1112_K. A first terminal of the common impedance RPU11 is coupled to the connection circuit 1113. The first terminal of the common impedance RPU11 may be coupled to the driving terminal of the main driving circuit 1111 and the driving terminal of each of the auxiliary driving circuits 1112_1 to 1112_K through the connection circuit 1113. A second terminal of the common impedance RPU11 is coupled to the output pad 130. The resistance value of the common impedance RPU11 may be determined according to the actual design.

The auxiliary driving circuits 1112_1 to 1112_K may selectively perform the output driving operation on the output pad 130. When the control signals 111_1 to 111_K disable the auxiliary driving circuits 1112_1 to 1112_K, only the main driving circuit 1111 provides the output current to the output pad 130 through the connection circuit 1113 and the common impedance RPU11. Based on compensation for process offsets and/or other requirements (for example, impedance matching or slew rate adjustment), one or more of the auxiliary driving circuits 1112_1 to 1112_K may be selectively enabled. The enabled auxiliary driving circuit may perform the output driving operation on the output pad 130 through the connection circuit 1113 and the common impedance RPU11 together with the main driving circuit 1111.

In the embodiment shown in FIG. 11, the pull-down driver 122 includes a common impedance RPD11, a connection circuit 1123, a main driving circuit 1121, and at least one auxiliary driving circuit, such as Z auxiliary driving circuits 1122_1, . . . , and 1122_Z shown in FIG. 11. The resistance value of the common impedance RPD11 may be determined according to the actual design. In the embodiment shown in FIG. 11, the control signal 112 includes control signals 112_0, 112_1, . . . , and 112_Z. Control terminals of the main driving circuit 1121 and the auxiliary driving circuits 1122_1 to 1122_Z are coupled to the front-end circuit 110 to receive the control signals 112_0 to 112_Z. The main driving circuit 1121, the auxiliary driving circuits 1122_1 to 1122_Z, the connection circuit 1123, and the common impedance RPD11 may be analogized with reference to the relevant description of the main driving circuit 1111, the auxiliary driving circuits 1112_1 to 1112_K, the connection circuit 1113, and the common impedance RPU11, so there will be no repetition. For any one of the main driving circuit 1121 and the auxiliary driving circuits 1122_1 to 1122_Z shown in FIG. 11, reference may be made to the relevant description of the pull-down driving circuit 700 shown in FIG. 7, the pull-down driving circuit 800 shown in FIG. 8, the pull-down driving circuit 900 shown in FIG. 9, or the pull-down driving circuit 1000 shown in FIG. 10.

When the control signals 112_1 to 112_Z disable the auxiliary driving circuits 1122_1 to 1122_Z, only the main driving circuit 1121 draws current from the output pad 130. Based on compensation for process offset and/or other requirements (for example, impedance matching or slew rate adjustment), one or more of the auxiliary driving circuits 1122_1 to 1122_Z may be selectively enabled. The enabled auxiliary driving circuit may perform the output driving operation on the output pad 130 together with the main driving circuit 1121.

The detailed implementation manners of the connection circuit 1113 and the connection circuit 1123 shown in FIG. 11 may be determined according to actual requirements. Possible implementations of the connection circuit 1113 shown in FIG. 11 will be described below with several embodiments.

Figure 12:
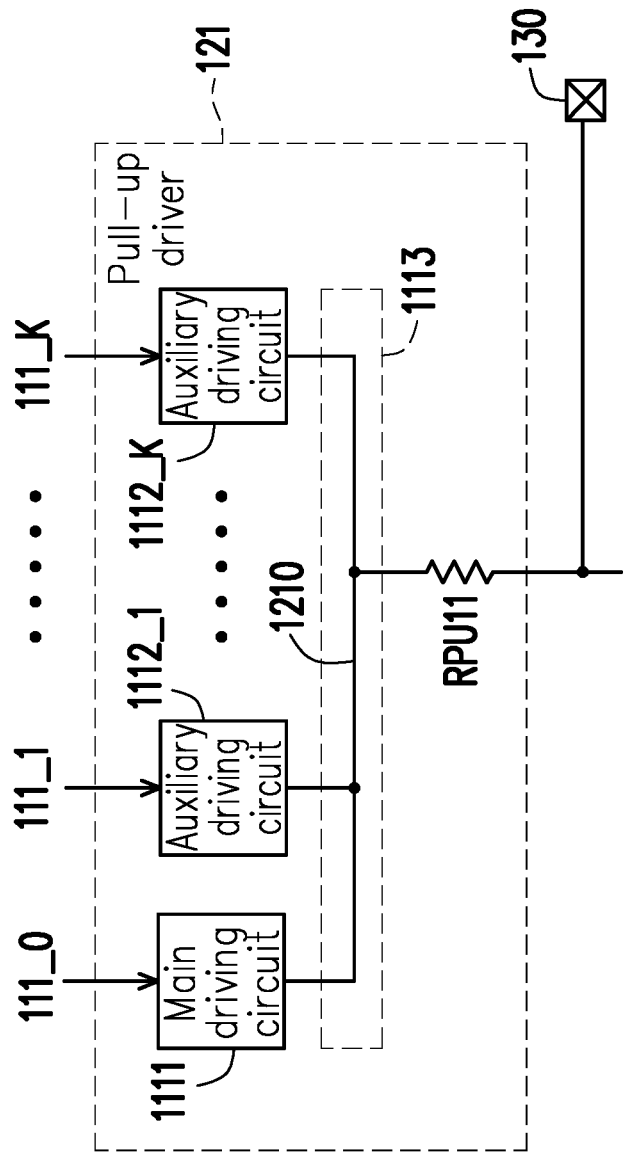
FIG. 12 is a schematic circuit diagram of a connection circuit shown in FIG. 11 according to an embodiment of the disclosure.

FIG. 12 is a schematic circuit diagram of the connection circuit 1113 shown in FIG. 11 according to an embodiment of the disclosure. In the embodiment shown in FIG. 12, the connection circuit 1113 includes a conducting wire 1210. The conducting wire 1210 is coupled to the driving terminal of the main driving circuit 1111 and the driving terminal of each of the auxiliary driving circuits 1112_1 to 1112_K. The conducting wire 1210 is also coupled to a first terminal of the common impedance RPU11. Compared with the embodiment shown in FIG. 2, in the case where "the specifications of the main driving circuit 1111 and the auxiliary driving circuits 1112_1 to 1112_K shown in FIG. 12 are the same as the specifications of the main driving circuit 211 and the auxiliary driving circuits 212_1 to 212_K shown in FIG. 2" and "the driving ability (output current) of the output pad 130 shown in FIG. 12 is the same as the driving ability of the output pad 130 shown in FIG. 2", the impedance value of the common impedance RPU11 shown in FIG. 12 may be less than the sum of the resistance values of the pull-up resistor RPU0 and the auxiliary pull-up resistor RPU1 shown in FIG. 2. Based on this, the element size of the common impedance RPU11 may be reduced, thereby reducing the parasitic capacitance.

Furthermore, in the case where "the driving ability (output current) of the output pad 130 shown in FIG. 12 is the same as the driving ability of the output pad 130 shown in FIG. 2", other than the impedance value of the common impedance RPU11 shown in FIG. 12 being less than the sum of the resistance values of the main pull-up resistor RPU0 and the auxiliary pull-up resistor RPU1 shown in FIG. 2, the driving ability (output current) of the main driving circuit 1111 and the auxiliary driving circuits 1112_1 to 1112_K shown in FIG. 12 may also be less than the driving ability of the main driving circuit 211 and the auxiliary driving circuits 212_1 to 212_K shown in FIG. 2. That is, compared with the embodiment shown in FIG. 2, the element sizes of the main driving circuit 1111 and the auxiliary driving circuits 1112_1 to 1112_K shown in FIG. 12 may be further reduced, thereby reducing the parasitic capacitance. Therefore, compared with the embodiment shown in FIG. 2, the area occupied by the overall circuit after the simplified combined structure shown in FIG. 12 may be effectively reduced. Due to the decrease in the parasitic capacitance, for the overall load capacitance of the output terminal, the equivalent capacitance load is effectively reduced, thereby facilitating the improvement in the overall speed.

Figure 13:
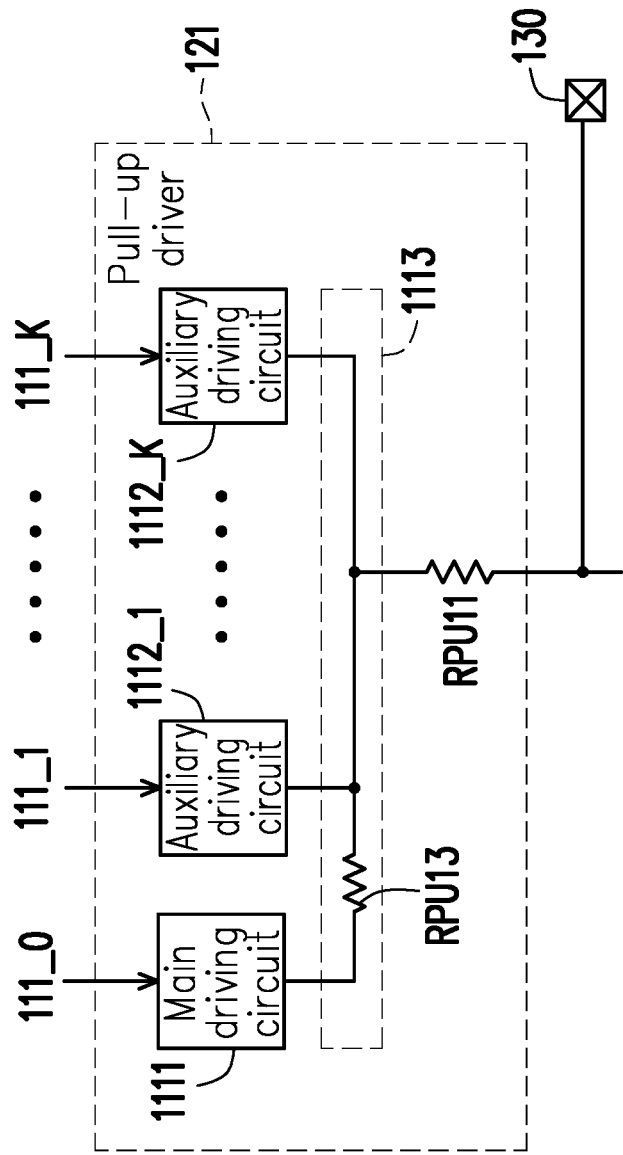
FIG. 13 is a schematic circuit diagram of a connection circuit shown in FIG. 11 according to another embodiment of the disclosure.

FIG. 13 is a schematic circuit diagram of the connection circuit 1113 shown in FIG. 11 according to another embodiment of the disclosure. In the embodiment shown in FIG. 13, the connection circuit 1113 includes a resistor RPU13. A first terminal of the resistor RPU13 is coupled to the driving terminal of the main driving circuit 1111. A second terminal of the resistor RPU13 is coupled to the driving terminal of each of the auxiliary driving circuits 1112_1 to 1112_K and the first terminal of the common impedance RPU11. The embodiment shown in FIG. 13 maintains the characteristics of the common impedance RPU11 shown in FIG. 12. The resistance value of the common impedance RPU11 shown in FIG. 12 can be divided into two parts as the resistance value of the common impedance RPU11 and the resistance value of the resistor RPU13 shown in FIG. 13. Therefore, the total resistance of the common impedance RPU11 and the resistor RPU13 shown in FIG. 13 will be equal to (or close to) the resistance of common impedance RPU11 shown in FIG. 12. Compared with the embodiment shown in FIG. 2, in the case where "the specifications of the main driving circuit 1111 and the auxiliary driving circuits 1112_1 to 1112_K shown in FIG. 13 are the same as the specifications of the main driving circuit 211 and the auxiliary driving circuits 212_1 to 212_K shown in FIG. 2" and "the driving ability (output current) of the output pad 130 shown in FIG. 13 is the same as the driving ability of the output pad 130 shown in FIG. 2", the sum of the resistance values of the common impedance RPU11 and the resistor RPU13 shown in FIG. 13 may be less than the sum of the resistance values of the pull-up resistor RPU0 and the auxiliary pull-up resistor RPU1 shown in FIG. 2. Based on this, the element size of the common impedance RPU11 and the resistor RPU13 may be reduced, thereby reducing the parasitic capacitance.

Figure 14:
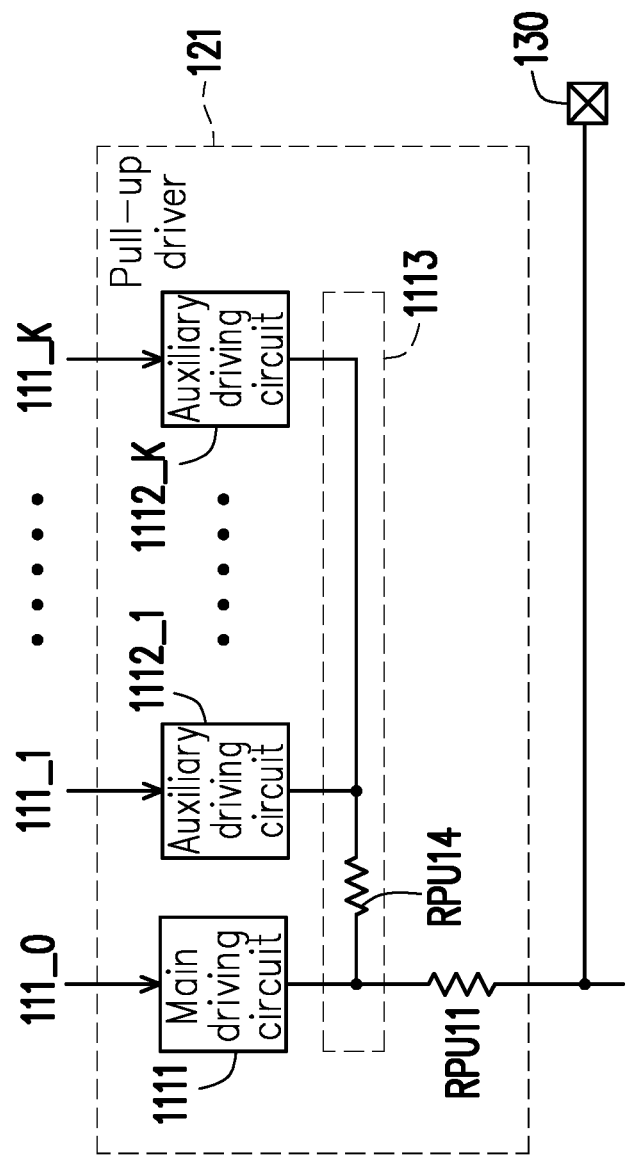
FIG. 14 is a schematic circuit diagram of a connection circuit shown in FIG. 11 according to yet another embodiment of the disclosure.

FIG. 14 is a schematic circuit diagram of the connection circuit 1113 shown in FIG. 11 according to yet another embodiment of the disclosure. In the embodiment shown in FIG. 14, the connection circuit 1113 includes a resistor RPU14. A first terminal of the resistor RPU14 is coupled to the driving terminal of each of the auxiliary driving circuits 1112_1 to 1112_K. A second terminal of the resistor RPU14 is coupled to the driving terminal of the main driving circuit 1111 and the first terminal of the common impedance RPU11. The embodiment shown in FIG. 14 maintains the characteristics of the common impedance RPU11 shown in FIG. 12. The resistance value of the common impedance RPU11 shown in FIG. 12 can be divided into two parts as the resistance value of the common impedance RPU11 and the resistance value of the resistor RPU14 shown in FIG. 14. Therefore, the total resistance of the common impedance RPU11 and the resistor RPU14 shown in FIG. 14 will be equal to (or close to) the resistance of common impedance RPU11 shown in FIG. 12. Compared with the embodiment shown in FIG. 2, in the case where "the specifications of the main driving circuit 1111 and the auxiliary driving circuits 1112_1 to 1112_K shown in FIG. 14 are the same as the specifications of the main driving circuit 211 and the auxiliary driving circuits 212_1 to 212_K shown in FIG. 2" and "the driving ability (output current) of the output pad 130 shown in FIG. 14 is the same as the driving ability of the output pad 130 shown in FIG. 2", the sum of the resistance values of the common impedance RPU11 and the resistor RPU14 shown in FIG. 14 may be less than the sum of the resistance values of the pull-up resistor RPU0 and the auxiliary pull-up resistor RPU1 shown in FIG. 2. Based on this, the element size of the common impedance RPU11 and the resistor RPU14 may be reduced, thereby reducing the parasitic capacitance.

Figure 15:
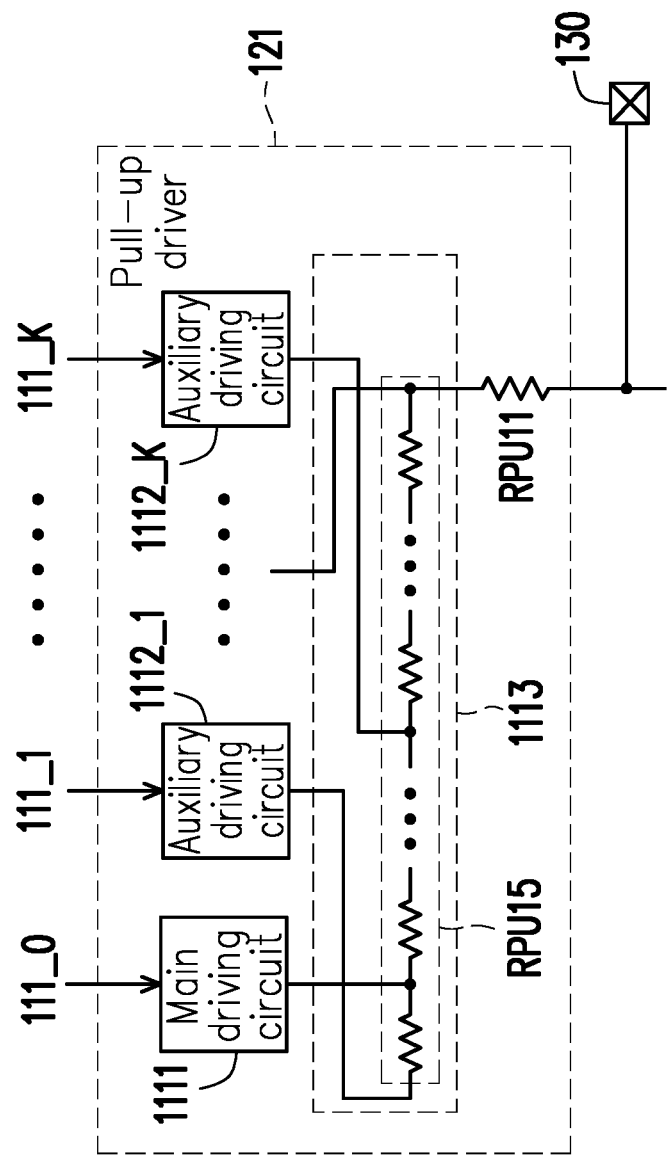
FIG. 15 is a schematic circuit diagram of a connection circuit shown in FIG. 11 according to a further embodiment of the disclosure.

FIG. 15 is a schematic circuit diagram of the connection circuit 1113 shown in FIG. 11 according to a further embodiment of the disclosure. In the embodiment shown in FIG. 15, the connection circuit 1113 includes a resistor string RPU15 having multiple connection nodes. The driving terminal of the main driving circuit 1111 is coupled to one of the connection nodes of the resistor string RPU15. Each of the auxiliary driving circuits 1112_1 to 1112_K is coupled to a corresponding connection node among the connection nodes of the resistor string RPU15. The first terminal of the common impedance RPU11 is coupled to one of the connection nodes of the resistor string RPU15. The connection relationship between the connection nodes of the resistor string RPU15 and the main driving circuit 1111, the auxiliary driving circuits 1112_1 to 1112_K, and the common impedance RPU11 may be determined according to the actual design, and the connection relationship shown in FIG. 15 is an example of many connection relationships. For example, in another embodiment, a plurality of auxiliary driving circuits among the auxiliary driving circuits 1112_1 to 1112_K may be commonly connected to same one corresponding connection node among the connection nodes of the resistor string RPU15. In yet another embodiment, each of the auxiliary driving circuits 1112_1 to 1112_K may be respectively connected to different connection nodes of the resistor string RPU15.

The embodiment shown in FIG. 15 maintains the characteristics of the common impedance RPU11 shown in FIG. 12. The resistance value of the common impedance RPU11 shown in FIG. 12 can be divided into two parts as the resistance value of the common impedance RPU11 and the resistance value of the resistor string RPU15 shown in FIG. 15. Therefore, the total resistance of the common impedance RPU11 and the resistor string RPU15 shown in FIG. 15 will be equal to (or close to) the resistance of common impedance RPU11 shown in FIG. 12. Compared with the embodiment shown in FIG. 2, in the case where "the specifications of the main driving circuit 1111 and the auxiliary driving circuits 1112_1 to 1112_K shown in FIG. 15 are the same as the specifications of the main driving circuit 211 and the auxiliary driving circuits 212_1 to 212_K shown in FIG. 2" and "the driving ability (output current) of the output pad 130 shown in FIG. 15 is the same as the driving ability of the output pad 130 shown in FIG. 2", the sum of the resistance values of the common impedance RPU11 and the resistor string RPU15 shown in FIG. 15 may be less than the sum of the resistance values of the pull-up resistor RPU0 and the auxiliary pull-up resistor RPU1 shown in FIG. 2. Based on this, the element size of the common impedance RPU11 and the resistor string RPU15 may be reduced, thereby reducing the parasitic capacitance.

Figure 16:
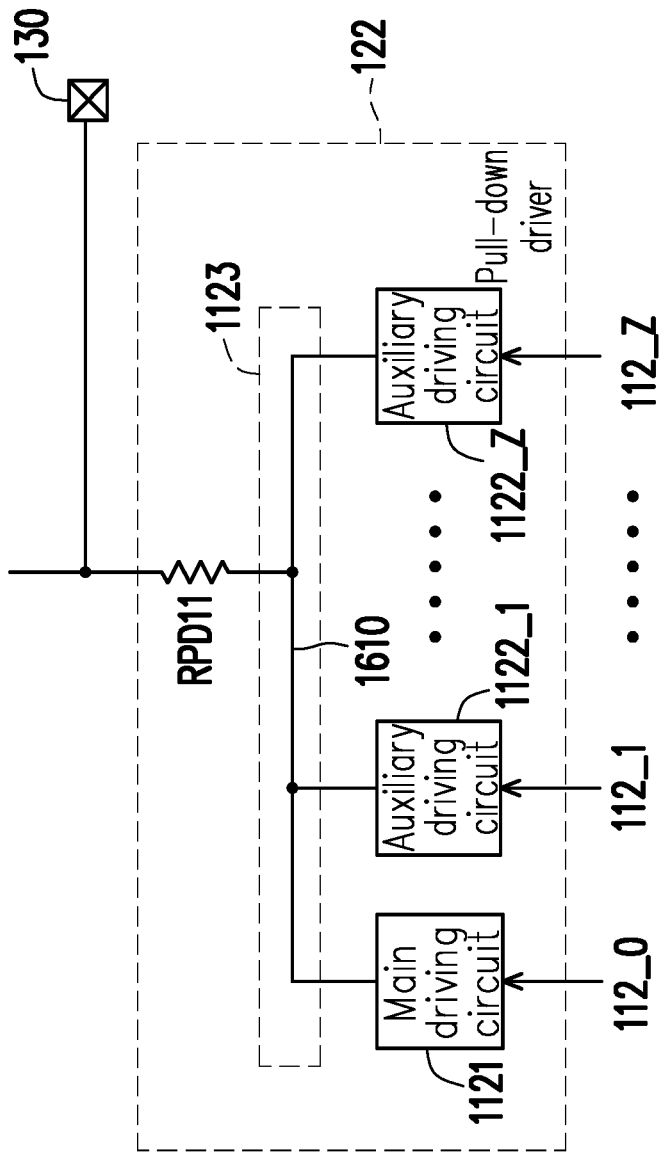
FIG. 16 is a schematic circuit diagram of a connection circuit shown in FIG. 11 according to an embodiment of the disclosure.

FIG. 16 is a schematic circuit diagram of the connection circuit 1123 shown in FIG. 11 according to an embodiment of the disclosure. In the embodiment shown in FIG. 16, the connection circuit 1123 includes a conducting wire 1610. The conducting wire 1610 is coupled to the driving terminal of the main driving circuit 1121 and the driving terminal of each of the auxiliary driving circuits 1122_1 to 1122_Z. The conducting wire 1610 is also coupled to the first terminal of the common impedance RPD11. Compared with the embodiment shown in FIG. 2, in the case where "the specifications of the main driving circuit 1121 and the auxiliary driving circuits 1122_1 to 1122_Z shown in FIG. 16 are the same as the specifications of the main driving circuit 221 and the auxiliary driving circuits 222_1 to 222_Z shown in FIG. 2" and "the driving ability (output current) of the output pad 130 shown in FIG. 16 is the same as the driving ability of the output pad 130 shown in FIG. 2", the impedance value of the common impedance RPD11 shown in FIG. 16 may be less than the sum of the resistance values of the main pull-down resistor RPD0 and the auxiliary pull-down resistor RPD1 shown in FIG. 2. Based on this, the element size of the common impedance RPD11 may be reduced, thereby reducing the parasitic capacitance.

Furthermore, in the case where "the driving ability (output current) of the output pad 130 shown in FIG. 16 is the same as the driving ability of the output pad 130 shown in FIG. 2", other than the impedance value of the common impedance RPD11 shown in FIG. 16 being less than the sum of the resistance values of the main pull-down resistor RPD0 and the auxiliary pull-down resistor RPD1 shown in FIG. 2, the driving ability (output current) of the main driving circuit 1121 and the auxiliary driving circuits 1122_1 to 1122_Z shown in FIG. 16 may also be less than the driving ability of the main driving circuit 221 and the auxiliary driving circuits 222_1 to 222_Z shown in FIG. 2. That is, compared with the embodiment shown in FIG. 2, the element sizes of the main driving circuit 1121 and the auxiliary driving circuits 1122_1 to 1122_Z shown in FIG. 16 may be further reduced, thereby reducing the parasitic capacitance. Therefore, compared with the embodiment shown in FIG. 2, the area occupied by the overall circuit after the simplified combined structure shown in FIG. 16 may be effectively reduced. Due to the decrease in the parasitic capacitance, for the overall load capacitance of the output terminal, the equivalent capacitance load is effectively reduced, thereby facilitating the improvement in the overall speed.

Figure 17:
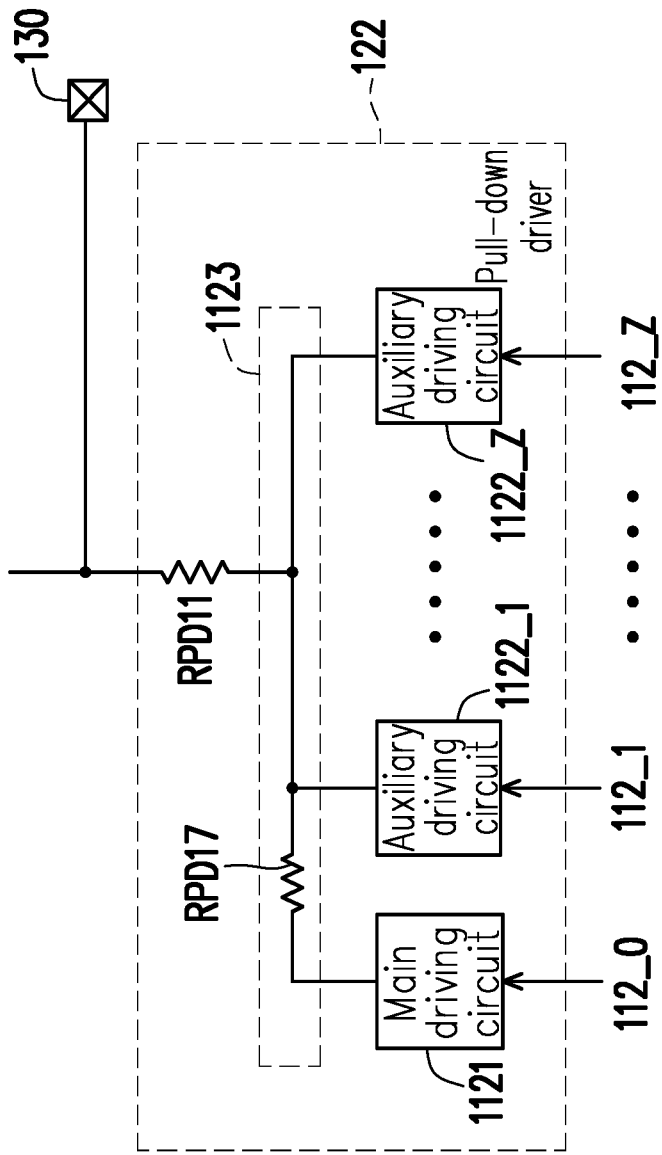
FIG. 17 is a schematic circuit diagram of a connection circuit shown in FIG. 11 according to another embodiment of the disclosure.

FIG. 17 is a schematic circuit diagram of the connection circuit 1123 shown in FIG. 11 according to another embodiment of the disclosure. In the embodiment shown in FIG. 17, the connection circuit 1123 includes a resistor RPD17. A first terminal of the resistor RPD17 is coupled to the driving terminal of the main driving circuit 1121. A second terminal of the resistor RPD17 is coupled to the driving terminal of each of the auxiliary driving circuits 1122_1 to 1122_Z and the first terminal of the common impedance RPD11. The embodiment shown in FIG. 17 maintains the characteristics of the common impedance RPD11 shown in FIG. 16. The resistance value of the common impedance RPD11 shown in FIG. 16 can be divided into two parts as the resistance value of the common impedance RPD11 and the resistance value of the resistor RPD17 shown in FIG. 17. Therefore, the total resistance of the common impedance RPD11 and the resistor RPD17 shown in FIG. 17 will be equal to (or close to) the resistance of common impedance RPD11 shown in FIG. 16. Compared with the embodiment shown in FIG. 2, in the case where "the specifications of the main driving circuit 1121 and the auxiliary driving circuits 1122_1 to 1122_Z shown in FIG. 17 are the same as the specifications of the main driving circuit 221 and the auxiliary driving circuits 222_1 to 222_Z shown in FIG. 2" and "the driving ability (output current) of the output pad 130 shown in FIG. 17 is the same as the driving ability of the output pad 130 shown in FIG. 2", the sum of the resistance values of the common impedance RPD11 and the resistor RPD17 shown in FIG. 17 may be less than the sum of the resistance values of the main pull-down resistor RPD0 and the auxiliary pull-down resistor RPD1 shown in FIG. 2. Based on this, the element size of the common impedance RPD11 and the resistor RPD17 may be reduced, thereby reducing the parasitic capacitance.

Figure 18:
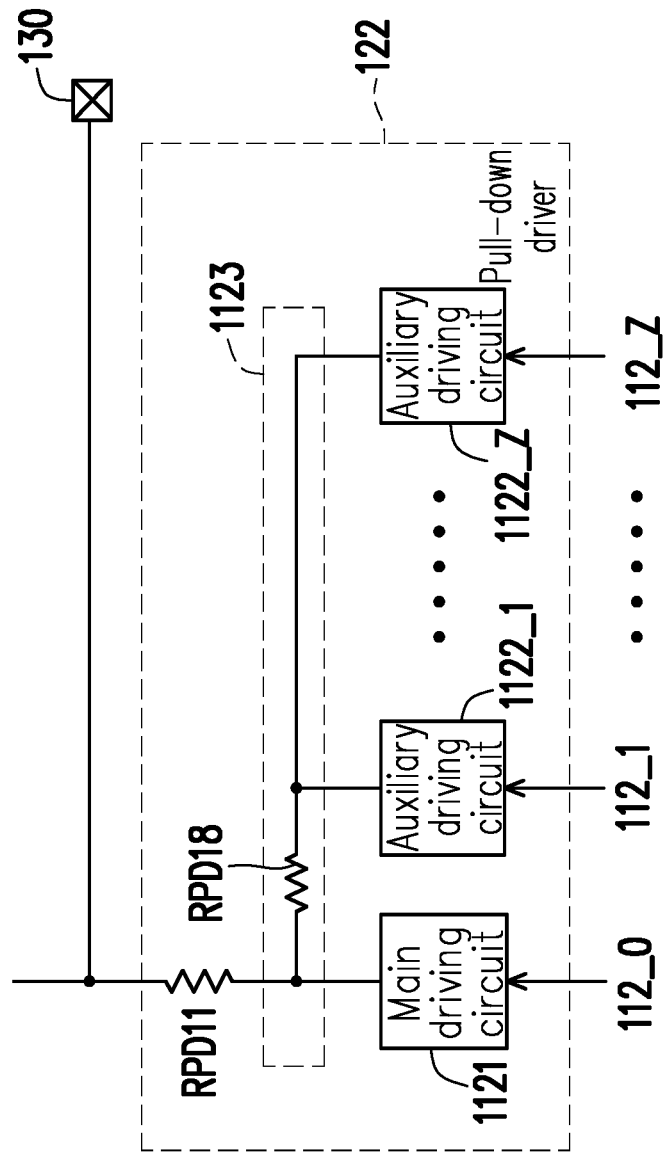
FIG. 18 is a schematic circuit diagram of a connection circuit shown in FIG. 11 according to yet another embodiment of the disclosure.

FIG. 18 is a schematic circuit diagram of the connection circuit 1123 shown in FIG. 11 according to yet another embodiment of the disclosure. In the embodiment shown in FIG. 18, the connection circuit 1123 includes a resistor RPD18. A first terminal of the resistor RPD18 is coupled to the driving terminal of each of the auxiliary driving circuits 1122_1 to 1122_Z. A second terminal of the resistor RPD18 is coupled to the driving terminal of the main driving circuit 1121 and the first terminal of the common impedance RPD11. The embodiment shown in FIG. 18 maintains the characteristics of the common impedance RPD11 shown in FIG. 16. The resistance value of the common impedance RPD11 shown in FIG. 16 can be divided into two parts as the resistance value of the common impedance RPD11 and the resistance value of the resistor RPD18 shown in FIG. 18. Therefore, the total resistance of the common impedance RPD11 and the resistor RPD18 shown in FIG. 18 will be equal to (or close to) the resistance of common impedance RPD11 shown in FIG. 16. Compared with the embodiment shown in FIG. 2, in the case where "the specifications of the main driving circuit 1121 and the auxiliary driving circuits 1122_1 to 1122_Z shown in FIG. 18 are the same as the specifications of the main driving circuit 221 and the auxiliary driving circuits 222_1 to 222_Z shown in FIG. 2" and "the driving ability (output current) of the output pad 130 shown in FIG. 18 is the same as the driving ability of the output pad 130 shown in FIG. 2", the sum of the resistance values of the common impedance RPD11 and the resistor RPD18 shown in FIG. 18 may be less than the sum of the resistance values of the main pull-down resistor RPD0 and the auxiliary pull-down resistor RPD1 shown in FIG. 2. Based on this, the element size of the common impedance RPD11 and the resistor RPD18 may be reduced, thereby reducing the parasitic capacitance.

Figure 19:
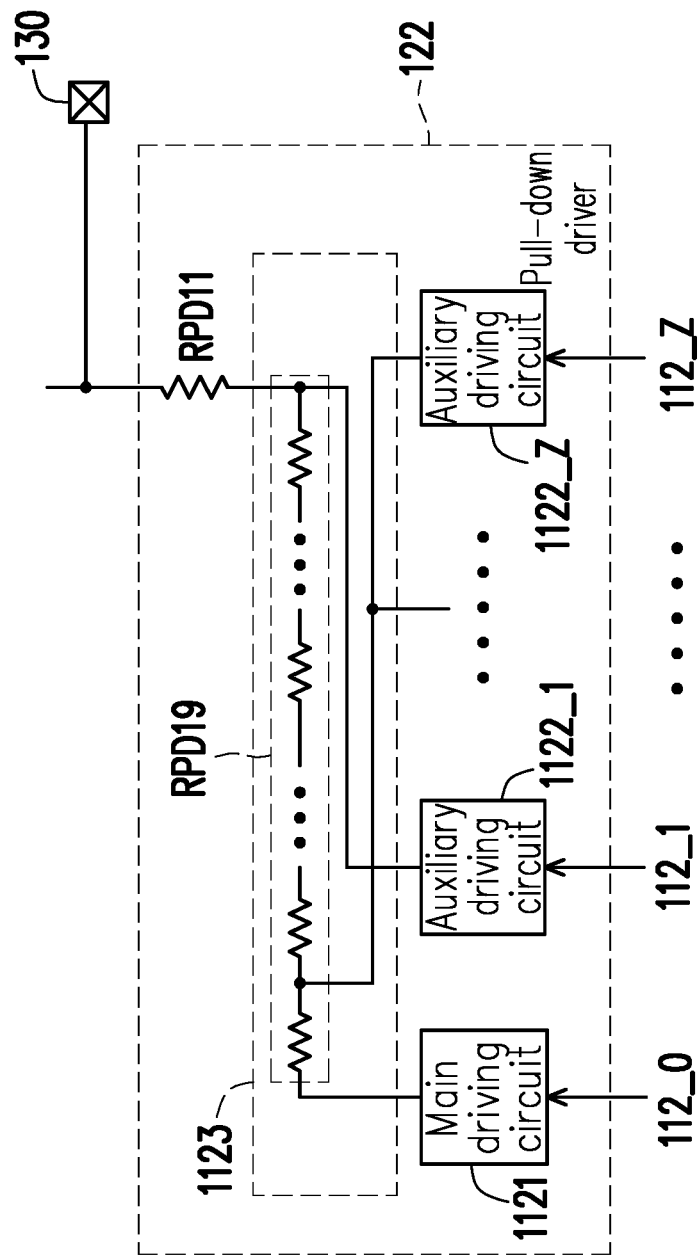
FIG. 19 is a schematic circuit diagram of a connection circuit shown in FIG. 11 according to a further embodiment of the disclosure.

FIG. 19 is a schematic circuit diagram of the connection circuit 1123 shown in FIG. 11 according to a further embodiment of the disclosure. In the embodiment shown in FIG. 19, the connection circuit 1123 includes a resistor string RPD19 having multiple connection nodes. The driving terminal of the main driving circuit 1121 is coupled to one of the connection nodes of the resistor string RPD19. Each of the auxiliary driving circuits 1122_1 to 1122_Z is coupled to a corresponding connection node among the connection nodes of the resistor string RPD19. The first terminal of the common impedance RPD11 is coupled to one of the connection nodes of the resistor string RPD19. The connection relationship between the connection nodes of the resistor string RPD19 and the main driving circuit 1121, the auxiliary driving circuits 1122_1 to 1122_Z, and the common impedance RPD11 may be determined according to the actual design, and the connection relationship shown in FIG. 19 is an example of many connection relationships. For example, in another embodiment, a plurality of auxiliary driving circuits among the auxiliary driving circuits 1122_1 to 1122_Z may be commonly connected to same one corresponding connection node among the connection nodes of the resistor string RPD19. In yet another embodiment, each of the auxiliary driving circuits 1122_1 to 1122_Z may be respectively connected to different connection nodes of the resistor string RPD19.

The embodiment shown in FIG. 19 maintains the characteristics of the common impedance RPD11 shown in FIG. 16. The resistance value of the common impedance RPD11 shown in FIG. 16 can be divided into two parts as the resistance value of the common impedance RPD11 and the resistance value of the resistor string RPD19 shown in FIG. 19. Therefore, the total resistance of the common impedance RPD11 and the resistor string RPD19 shown in FIG. 19 will be equal to (or close to) the resistance of common impedance RPD11 shown in FIG. 16. Compared with the embodiment shown in FIG. 2, in the case where "the specifications of the main driving circuit 1121 and the auxiliary driving circuits 1122_1 to 1122_Z shown in FIG. 19 are the same as the specifications of the main driving circuit 221 and the auxiliary driving circuits 222_1 to 222_Z shown in FIG. 2" and "the driving ability (output current) of the output pad 130 shown in FIG. 19 is the same as the driving ability of the output pad 130 shown in FIG. 2", the sum of the resistance values of the common impedance RPD11 and the resistor string RPD19 shown in FIG. 19 may be less than the sum of the resistance values of the main pull-down resistor RPD0 and the auxiliary pull-down resistor RPD1 shown in FIG. 2. Based on this, the element size of the common impedance RPD11 and the resistor string RPD19 may be reduced, thereby reducing the parasitic capacitance.

In summary, the output pad 130 in the above embodiments is coupled to the main driving circuit 1111 and the auxiliary driving circuits 1112_1 to 1112_K through the common impedance RPU11 and the connection circuit 1113. The main driving circuit 1111 and the auxiliary driving circuits 1112_1 to 1112_K may share the common impedance RPU11 through the connection circuit 1113. Besides the main driving circuit 1111 that may perform the output driving operation on the output pad 130 through the common impedance RPU11, the auxiliary driving circuits 1112_1 to 1112_K may also selectively perform the output driving operation on the output pad 130 through the same common impedance RPU11. By analogy, the output pad 130 is coupled to the main driving circuit 1121 and the auxiliary driving circuits 1122_1 to 1122_Z through the common impedance RPD11 and the connection circuit 1123. Besides the main driving circuit 1121 that may perform the output driving operation on the output pad 130 through the common impedance RPD11, the auxiliary driving circuits 1122_1 to 1122_Z may also selectively perform the output driving operation on the output pad 130 through the same common impedance RPD11. Therefore, the OCD 120 may perform the output driving operation on the external circuit 10 connected to the output pad 130.

The main pull-up resistor RPU0 and the auxiliary pull-up resistor RPU1 shown in FIG. 2 are combined into a common impedance RPU11 shown in FIG. 11, and the main pull-down resistor RPD0 and the auxiliary pull-down resistor RPD1 shown in FIG. 2 are combined into a common impedance RPD11 shown in FIG. 11. As mentioned above, the resistance value of the common impedance RPU11 shown in FIG. 11 is smaller than the sum of the resistance values of the main pull-up resistor RPU0 and the auxiliary pull-up resistor RPU1 shown in FIG. 2, and the resistance value of the common impedance RPD11 shown in FIG. 11 is smaller than the sum of the resistance values of the main pull-down resistor RPD0 and the auxiliary pull-down resistor RPD1 shown in FIG. 2, and the size of the components shown in FIG. 11 can be reduced, thereby reducing the parasitic capacitance. The reduction of the parasitic capacitance is beneficial to the improvement of the overall operation speed.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. An off-chip driver, configured in an integrated circuit, comprising:
a pull-up driver, coupled to an output pad of the integrated circuit; and
a pull-down driver, coupled to the output pad,
wherein one of the pull-up driver and the pull-down driver comprises:
a first main driving circuit, used to perform an output driving operation on the output pad;
at least one first auxiliary driving circuit, used to selectively perform the output driving operation on the output pad;
a first connection circuit, coupled to a driving terminal of the first main driving circuit and a driving terminal of each of the at least one first auxiliary driving circuit; and
a first common impedance, having a first terminal coupled to the first connection circuit, wherein the first terminal of the first common impedance is coupled to the driving terminal of the first main driving circuit and the driving terminal of each of the at least one first auxiliary driving circuit through the first connection circuit, and a second terminal of the first common impedance is coupled to the output pad,
wherein the first connection circuit comprises a resistor having a first terminal coupled to the driving terminal of the first main driving circuit, wherein a second terminal of the resistor is coupled to the driving terminal of each of the at least one first auxiliary driving circuit and the first terminal of the first common impedance.

2. The off-chip driver according to claim 1, wherein the first connection circuit comprises:
a conducting wire, coupled to the driving terminal of the first main driving circuit and the driving terminal of each of the at least one first auxiliary driving circuit, and coupled to the first terminal of the first common impedance.

3. The off-chip driver according to claim 1, wherein other one of the pull-up driver and the pull-down driver comprises:
- a second main driving circuit, used to perform the output driving operation on the output pad;
- at least one second auxiliary driving circuit, used to selectively perform the output driving operation on the output pad;
- a second connection circuit, coupled to a driving terminal of the second main driving circuit and a driving terminal of each of the at least one second auxiliary driving circuit; and
- a second common impedance, having a first terminal coupled to the second connection circuit, wherein the first terminal of the second common impedance is coupled to the driving terminal of the second main driving circuit and the driving terminal of each of the at least one second auxiliary driving circuit through the second connection circuit, and a second terminal of the second common impedance is coupled to the output pad.

4. The off-chip driver according to claim 1, wherein one of the first main driving circuit and the at least one first auxiliary driving circuit comprises:
- a transistor, having a first terminal coupled to a voltage source, wherein a second terminal of the transistor is coupled to the driving terminal, and a control terminal of the transistor is controlled by a control signal.

5. The off-chip driver according to claim 1, wherein one of the first main driving circuit and the at least one first auxiliary driving circuit comprises:
- a transistor, having a first terminal coupled to a voltage source, wherein a control terminal of the transistor is controlled by a control signal; and
- a resistor, having a first terminal coupled to a second terminal of the transistor, wherein a second terminal of the resistor is coupled to the driving terminal.

6. The off-chip driver according to claim 1, wherein one of the first main driving circuit and the at least one first auxiliary driving circuit comprises:
- a plurality of transistors, connected in series between a voltage source and the driving terminal, wherein a control terminal of each of the transistors is controlled by a control signal.

7. The off-chip driver according to claim 1, wherein one of the first main driving circuit and the at least one first auxiliary driving circuit comprises:
- a resistor, having a first terminal coupled to the driving terminal; and
- a plurality of transistors, connected in series between a voltage source and a second terminal of the resistor, wherein a control terminal of each of the transistors is controlled by a control signal.

8. An off-chip driver, configured in an integrated circuit, comprising:
- a pull-up driver, coupled to an output pad of the integrated circuit; and
- a pull-down driver, coupled to the output pad,
- wherein one of the pull-up driver and the pull-down driver comprises:
  - a first main driving circuit, used to perform an output driving operation on the output pad;
  - at least one first auxiliary driving circuit, used to selectively perform the output driving operation on the output pad;
  - a first connection circuit, coupled to a driving terminal of the first main driving circuit and a driving terminal of each of the at least one first auxiliary driving circuit; and
  - a first common impedance, having a first terminal coupled to the first connection circuit, wherein the first terminal of the first common impedance is coupled to the driving terminal of the first main driving circuit and the driving terminal of each of the at least one first auxiliary driving circuit through the first connection circuit, and a second terminal of the first common impedance is coupled to the output pad,
- wherein the first connection circuit comprises:
- a resistor, having a first terminal coupled to the driving terminal of each of the at least one first auxiliary driving circuit, wherein a second terminal of the resistor is coupled to the driving terminal of the first main driving circuit and the first terminal of the first common impedance.

9. An off-chip driver, configured in an integrated circuit, comprising:
- a pull-up driver, coupled to an output pad of the integrated circuit; and
- a pull-down driver, coupled to the output pad,
- wherein one of the pull-up driver and the pull-down driver comprises:
  - a first main driving circuit, used to perform an output driving operation on the output pad;
  - at least one first auxiliary driving circuit, used to selectively perform the output driving operation on the output pad;
  - a first connection circuit, coupled to a driving terminal of the first main driving circuit and a driving terminal of each of the at least one first auxiliary driving circuit; and
  - a first common impedance, having a first terminal coupled to the first connection circuit, wherein the first terminal of the first common impedance is coupled to the driving terminal of the first main driving circuit and the driving terminal of each of the at least one first auxiliary driving circuit through the first connection circuit, and a second terminal of the first common impedance is coupled to the output pad,
- wherein the first connection circuit comprises:
- a resistor string, having a plurality of connection nodes, wherein the driving terminal of the first main driving circuit is coupled to one of the connection nodes, the at least one first auxiliary driving circuit is coupled to at least one of the connection nodes, and the first terminal of the first common impedance is coupled to one of the connection nodes.

* * * * *